United States Patent
Nabetani

Patent Number: 6,097,186
Date of Patent: Aug. 1, 2000

[54] PHASED-ARRAY COIL, RECEIVE SIGNAL PROCESSING CIRCUIT, AND MRI APPARATUS

[75] Inventor: Akira Nabetani, Tokyo, Japan

[73] Assignee: GE Yokogawa Medical Systems, Limited, Tokyo, Japan

[21] Appl. No.: 09/300,304

[22] Filed: Apr. 27, 1999

[30] Foreign Application Priority Data

May 20, 1998 [JP] Japan .................................. 10-138412

[51] Int. Cl.[7] ........................................................ G01V 3/00
[52] U.S. Cl. ............................. 324/319; 324/318; 324/322
[58] Field of Search .................................. 324/318, 322, 324/319

[56] References Cited

U.S. PATENT DOCUMENTS

| | | | |
|---|---|---|---|
| 4,825,162 | 4/1989 | Roemer et al. ......................... | 324/318 |
| 5,329,233 | 7/1994 | Hayes ...................................... | 324/318 |
| 5,500,596 | 3/1996 | Grist et al. .............................. | 324/318 |

*Primary Examiner*—Christine K. Oda
*Assistant Examiner*—Brij B. Shrivastav
*Attorney, Agent, or Firm*—Moonray Kojima

[57] ABSTRACT

In order to provide a phased-array coil having a highly homogeneous sensitivity region, an opposing coil set 10 composed of a pair of gutter-shaped coils 10*a* and 10*b* whose concave surfaces face each other, an opposing coil set 20 composed of a pair of gutter-shaped coils 20*a* and 20*b* whose concave surfaces face each other, an opposing coil set 30 composed of a pair of gutter-shaped coils 30*a* and 30*b* whose concave surfaces face each other, and an opposing coil set 40 composed of a pair of gutter-shaped coils 40*a* and 40*b* whose concave surfaces face each other are disposed around the center axis J of an imaginary cylinder at an angular spacing of 45°, with each coil overlapping the adjacent ones by about 10% of the coil surface area, to be assembled into a cylindrical shape as a whole.

10 Claims, 7 Drawing Sheets

PHASED-ARRAY COIL, RECEIVE SIGNAL PROCESSING CIRCUIT, AND MRI APPARATUS

BACKGROUND OF THE INVENTION

The present invention relates to a phased-array coil and a receive signal processing circuit, and more particularly to a phased-array coil having a highly homogeneous sensitivity region and a receive signal processing circuit capable of suitably processing receive signals received at such phased-array coil.

National Publication No. 2-500175 of Japanese Patent Application (counterpart U.S. Pat. No. 4,825,162) discloses an example of a phased-array coil for use in a conventional MRI (magnetic resonance imaging) apparatus in its accompanying FIG. 4. Such conventional phased-array coils have poor homogeneity of the coil sensitivity characteristics in the coil axis direction. This leads to disadvantages in imaging of head and abdominal parts, which require a homogeneous sensitivity region.

SUMMARY OF THE INVENTION

It is therefore an object of the present invention to provide a phased-array coil having a highly homogeneous sensitivity region and a receive signal processing circuit capable of suitably processing receive signals received at such phased-array coil.

In accordance with a first aspect of the invention, there is provided a phased-array coil comprising four sets of opposing coils, each set consisting of a pair of gutter-shaped coils whose concave surfaces face each other and whose coil surfaces overlap the coil surfaces of adjacent ones by about 10% of the coil surface area, the gutter-shaped coils being disposed around the center axis of an imaginary cylinder at an angular spacing of 45° to be assembled into a cylindrical shape as a whole.

The phased-array coil of the first aspect has pairs of opposing gutter-shaped coils disposed on both sides of a spatial region therebetween, and therefore has improved sensitivity homogeneity over a phased-array coil having coils disposed only on one side (representative of the conventional phased-array coil). Moreover, no opposing coil set interacts either with the adjacent two coil sets among the other three coil sets because of coil surface overlapping, or with the remaining one coil set because the coil sets are geometrically orthogonal to each other. The S/N ratio is therefore high. Thus, there is provided a phased-array coil having high sensitivity homogeneity and a high S/N ratio.

In accordance with a second aspect of the invention, there is provided the phased-array coil as described regarding the first aspect, further comprising respective amplifiers having low input impedance corresponding to the four coil sets, respective A-D converting means corresponding to the four coil sets, and calculating means for performing digital operation.

In accordance with a third aspect of the invention, there is provided the phased-array coil as described regarding the first aspect, further comprising respective amplifiers having low input impedance corresponding to the four coil sets, two sets of quadrature compounding means for quadrature compounding signals having passed through two amplifiers which correspond to coil sets whose coils are not adjacent to each other of the four coil sets, A-D converting means for A-D converting outputs from the quadrature compounding means, and calculating means for performing digital operation using the A-D converted data.

In accordance with a fourth aspect of the invention, there is provided the phased-array coil as described regarding the first aspect, further comprising two sets of quadrature compounding means for quadrature compounding supplied receive signals which correspond to coil sets whose coils are not adjacent to each other of the four coil sets, impedance converting means for matching impedance between the quadrature compounding means and amplifiers, amplifiers having low input impedance corresponding to the impedance converting means, A-D converting means for A-D converting outputs from the amplifiers, and calculating means for performing digital operation using the A-D converted data.

In accordance with a fifth aspect of the invention, there is provided the phased-array coil as described regarding the fourth aspect, further comprising switching means before and after the quadrature compounding means and the impedance converting means to implement either the phased-array coil arrangement as described regarding the second aspect or the phased-array coil arrangement as described regarding the fourth aspect by switching of the switching means.

In accordance with a sixth aspect of the invention, there is provided the phased-array coil as described regarding the fifth aspect, further comprising a contrast agent detecting coil for detecting a contrast agent.

In accordance with a seventh aspect of the invention, there is provided a phased-array coil comprising a plurality of sets of opposing coils, each set consisting of a pair of planar coils which face each other with their coil surfaces partly overlapping the coil surfaces of adjacent ones, disposed around the center axis of an imaginary cylinder to be assembled into a cylindrical shape as a whole.

In the above construction, a planar coil refers to, for example, a flat planar coil, a curved planar coil and a bent planar coil. A cylindrical shape refers to, for example, a polygonal cylindrical shape, a circular cylindrical shape and a flat circular cylindrical shape.

The phased-array coil of the seventh aspect has a pair of opposing planar coils disposed on both sides of a spatial region therebetween, and therefore has improved sensitivity homogeneity over a phased-array coil having coils disposed only on one side (representative of the conventional phased-array coil). Thus, there is provided a phased-array coil having high sensitivity homogeneity. Besides, no opposing coil set interacts with the two adjacent coil sets among the other coil sets because of coil surface overlapping. Moreover, no coil set interacts with the set geometrically orthogonal thereto. Although each opposing coil set interacts with the non-adjacent and non-geometrically-orthogonal coil sets, the interaction can be removed by using a low input impedance preamplifier.

In accordance with an eighth aspect of the invention, there is provided a phased-array coil comprising a plurality of sets of opposing coils, each set consisting of a pair of planar coils which face each other with their coil surfaces partly overlapping the coil surface(s) of an adjacent one(s), the planar coils being disposed along an imaginary line.

In the above construction, a planar coil refers to, for example, a flat planar coil, a curved planar coil and a bent planar coil. A line refers to, for example, a straight line, a curved line and a bent line.

The phased-array coil of the eighth aspect has pairs of opposing planar coils disposed on both sides of a spatial region therebetween, and therefore has improved sensitivity homogeneity over a phased-array coil having coils disposed only on one side (representative of the conventional phased-array coil). Moreover, a plurality of such opposing coil sets are disposed along a line and, therefore, sensitivity homogeneity is increased in a large spatial region or in a spatial region of a shape conforming to the shape of an object to be imaged. Thus, there is provided a phased-array coil having high sensitivity homogeneity. Besides, no opposing coil set interacts with the adjacent coil set(s) among the other coil sets because of coil surface overlapping. Although each opposing coil set interacts with the non-adjacent coil sets, the interaction can be removed by using a low input impedance preamplifier.

In accordance with a ninth aspect of the invention, there is provided a receive signal processing circuit for processing receive signals received at the opposing coil sets in the phased-array coil as described regarding the first aspect, comprising first quadrature compounding means for quadrature compounding receive signals received by a first group of opposing coil sets, second quadrature compounding means for quadrature compounding receive signals received by a second group of opposing coil sets, said first and second groups of opposing coil sets defined by classifying the four sets of opposing coils into two groups by combining coil sets which are spaced 90° apart as one group, first converting means for A-D converting a signal having passed through the first quadrature compounding means, second converting means for A-D converting a signal having passed through the second quadrature compounding means, and calculating means for performing digital operation on the digitized signals.

The receive signal processing circuit as described regarding the ninth aspect quadrature compounds the receive signals from two geometrically orthogonal sets of opposing coils and then A-D converts the compounded signal. The required number of converting means can thus be reduced from four to two.

In accordance with a tenth aspect of the invention, there is provided an MRI apparatus comprising the phased-array coil as described regarding any of the first, seventh and eighth aspects, or comprising the phased-array coil as described regarding the first aspect and the receive signal processing circuit as described regarding the ninth aspect.

The MRI apparatus as described regarding the tenth aspect employs a phased-array coil having high sensitivity homogeneity and a high S/N ratio, and therefore a high quality image can be captured.

In accordance with an eleventh aspect of the invention, there is provided an MRI apparatus comprising the phased-array coil as described regarding any of the second–sixth aspects.

Thus, the phased-array coil of the present invention can provide a highly homogeneous sensitivity region, the receive signal processing circuit of the present invention can reduce the number of converting means, and the MRI apparatus of the present invention can capture a high quality image.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to several embodiments shown in the accompanying drawings.

First Embodiment

Figure 1:
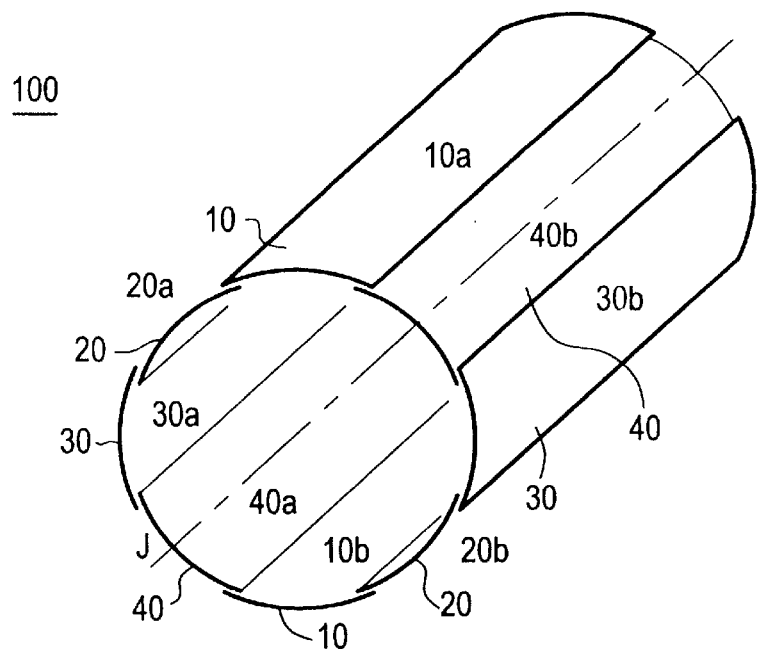
FIG. 1 is a schematic perspective view of a circular cylindrical phased-array coil in accordance with a first embodiment of the present invention.

FIG. 1 is a schematic perspective view of a circular cylindrical phased-array coil in accordance with a first embodiment of the present invention.

The circular cylindrical phased-array coil 100 comprises an opposing coil set 10 composed of a pair of gutter-shaped coils 10a and 10b whose concave surfaces face each other, an opposing coil set 20 composed of a pair of gutter-shaped coils 20a and 20b whose concave surfaces face each other, an opposing coil set 30 composed of a pair of gutter-shaped coils 30a and 30b whose concave surfaces face each other, and an opposing coil set 40 composed of a pair of gutter-shaped coils 40a and 40b whose concave surfaces face each other, disposed around the center axis J of an imaginary cylinder to be assembled into a circular cylinder shape as a whole.

Figure 2:
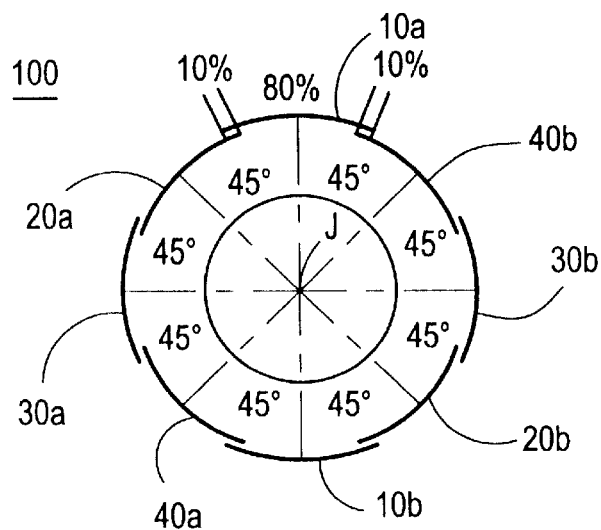
FIG. 2 is an explanatory view illustrating the arrangement of opposing coil sets in the circular cylindrical phased-array coil in accordance with the first embodiment of the present invention.

FIG. 2 is an explanatory view illustrating the arrangement of the opposing coil sets 10, 20, 30 and 40.

The opposing coil sets (10a, 10b), (20a, 20b), (30a, 30b) and (40a, 40b) are disposed at an angular spacing of 45° around the center axis J with each coil surface overlapping the coil surfaces of adjacent ones by about 10% of the coil surface area.

The opposing coil set (10a, 10b) does not interact with the adjacent two opposing coil sets (20a, 20b) and (40a, 40b) because about 10% of the coil surface areas overlap each other. The opposing coil set (10a, 10b) does not also interact with the remaining opposing coil set (30a, 30b) because they are geometrically orthogonal to each other. The same can be said of the other opposing coil sets. Therefore, the circular cylindrical phased-array coil 100 has no interaction between any combination of opposing coil sets 10, 20, 30 and 40.

Figure 3:
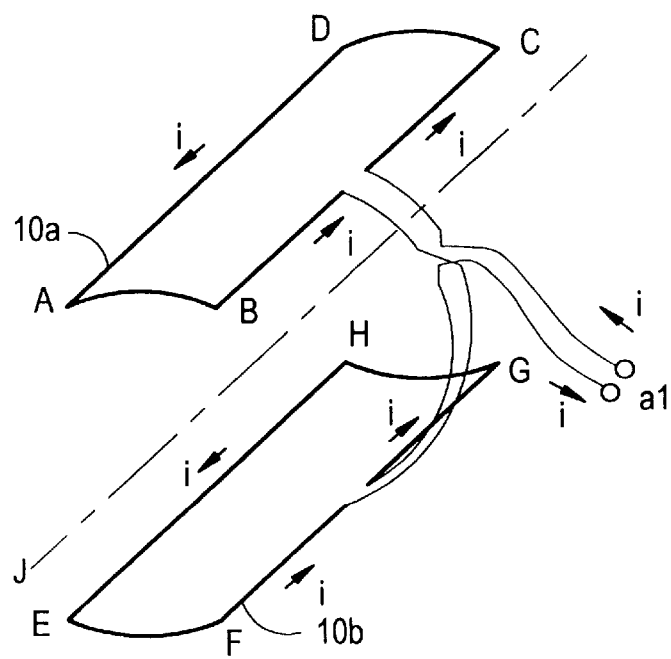
FIG. 3 is a perspective view illustrating a method of connection between opposing gutter-shaped coils.

FIG. 3 is a perspective view illustrating connection between the opposing gutter-shaped coils 10a and 10b.

The gutter-shaped coils 10a and 10b are connected in series, i.e., to form a so-called "8"-shaped coil.

Reference symbol "i" represents an electric current flowing through the opposing coils 10a and 10b. Reference symbol "a1" represents a $\lambda/2$ cable for extracting a receive signal received at the opposing coil set (10a, 10b).

The corners A, B, C and D of the gutter-shaped coil 10a and the corners F, E, H and G of the gutter-shaped coil 10b are respectively disposed symmetrically with respect to the center axis J.

The connection of the other opposing coil sets (20a, 20b), (30a, 30b) and (40a, 40b) is the same.

Figure 4A:
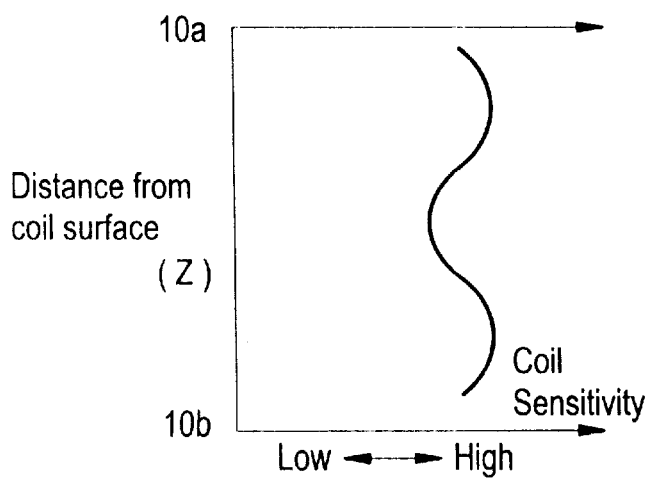
FIG. 4 shows a characteristic curve of coil sensitivity plotted against the distance in the direction perpendicular to the coil surfaces at the coil centers of the gutter-shaped coils.
Figure 4B:
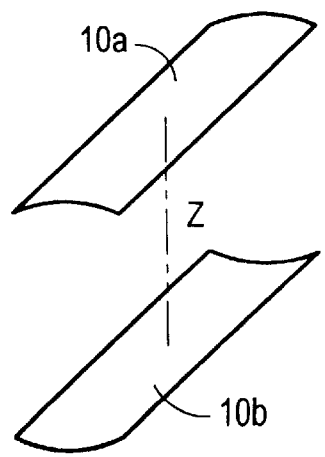

FIG. 4(a) shows a characteristic curve of the coil sensitivity along a line Z linking the coil centers of the gutter-shaped coils 10a and 10b shown in FIG. 4(b).

The homogeneity of the coil sensitivity within a spatial region between the gutter-shaped coils 10a and 10b is better than that of the conventional coil.

Figure 5:
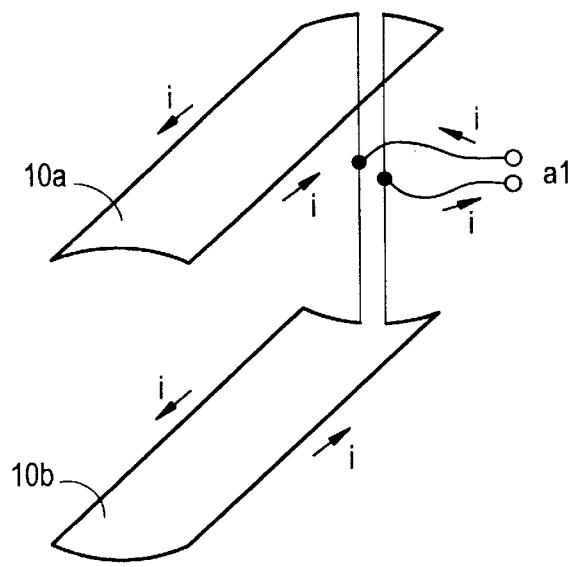
FIG. 5 is a perspective view illustrating another method of connection between the opposing gutter-shaped coils.

FIG. 5 is a perspective view illustrating another type of connection between the gutter-shaped coils 10a and 10b.

Here the gutter-shaped coils 10a and 10b are connected in parallel. The coils may instead be connected like this in parallel.

Figure 6:
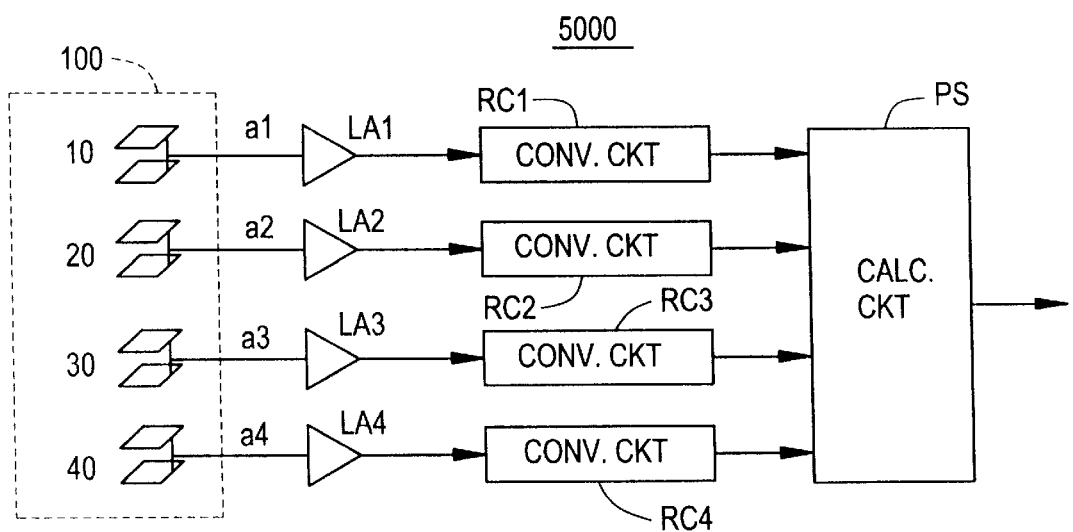
FIG. 6 is a block diagram of a receive signal processing circuit for processing receive signals received at the circular cylindrical phased-array coil in accordance with the first embodiment of the present invention.

As shown in FIG. 6, the receive signals received at the circular cylindrical phased-array coil 100 can be processed by a conventional receive signal processing circuit 5000.

The receive signal processing circuit 5000 comprises low input impedance preamplifiers LA1, LA2, LA3 and LA4 for amplifying the respective receive signals received at the opposing coil sets 10, 20, 30 and 40 in the phased-array coil 100, converting circuits RC1, RC2, RC3 and RC4 for frequency translation and A-D conversion, and a calculating circuit PS for performing digital operation on the digitized signals.

Reference symbols a1, a2, a3 and a4 represent $\lambda/2$ cables for extracting receive signals received at the opposing coil sets 10, 20, 30 and 40.

The phased-array coil 100 provides high sensitivity homogeneity within a circular cylindrical internal spatial region surrounded by the gutter-shaped coils 10a, ..., 40b. Moreover, because there is no interaction among the gutter-shaped coils 10a, ..., 40b, a high S/N ratio can be achieved.

Second Embodiment

Figure 7:
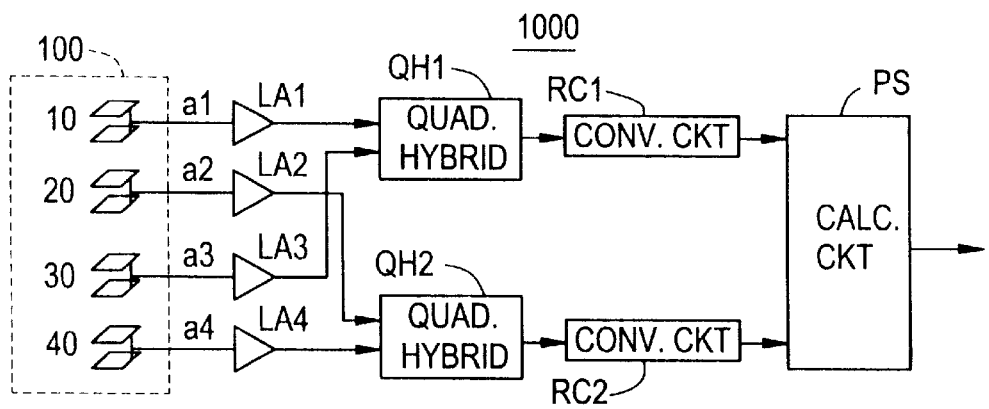
FIG. 7 is a block diagram of a receive signal processing circuit in accordance with a second embodiment of the present invention.

FIG. 7 is a block diagram illustrating a receive signal processing circuit in accordance with a second embodiment of the present invention.

The receive signal processing circuit 1000 comprises low input impedance preamplifiers LA1, LA2, LA3 and LA4 for amplifying the respective receive signals received at the opposing coil sets 10, 20, 30 and 40 in the phased-array coil 100, a first quadrature hybrid OH1 for quadrature compounding the receive signals received at the opposing coil sets 10 and 30 which are spaced 90° apart, a second quadrature hybrid QH2 for quadrature compounding the receive signals received at the opposing coil sets 20 and 40 which are spaced 90° apart, a first converting circuit RC1 for A-D converting the signal having passed through the first quadrature hybrid QH1, a second converting circuit RC2 for A-D converting the signal having passed through the second quadrature hybrid QH2, and a calculating circuit PS for performing digital operation on the digitized signals.

Since the receive signal processing circuit 1000 quadrature compounds the receive signals from the two opposing coil sets 10 and 30 orthogonal to each other and the receive signals from the two opposing coil sets 20 and 40 orthogonal to each other prior to supplying the signals to the converting circuits RC1 and RC2, only two converting circuits RC1 and RC2 are needed, thereby reducing overall cost.

Third Embodiment

Figure 8:
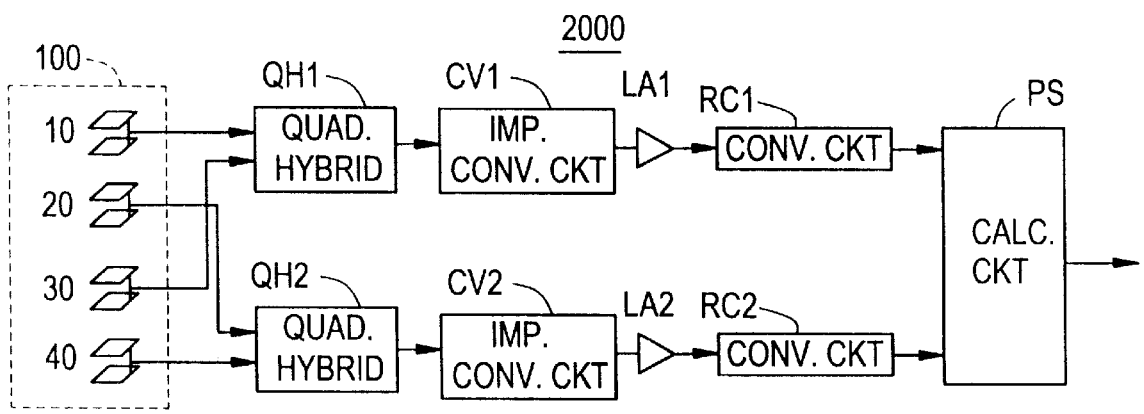
FIG. 8 is a block diagram of a receive signal processing circuit in accordance with a third embodiment of the present invention.

FIG. 8 is a block diagram illustrating a receive signal processing circuit in accordance with a third embodiment of the present invention.

The receive signal processing circuit 2000 comprises a first quadrature hybrid OH1 for quadrature compounding the receive signals received at the opposing coil sets 10 and 30 which are spaced 90° apart, a first low input impedance preamplifier LA1 for amplifying the signal having passed through the first quadrature hybrid QH1, a first impedance converting circuit CV1 for matching impedance between the first quadrature hybrid OH1 and the first low input impedance preamplifier LA1, a first converting circuit RC1 for frequency translating and A-D converting the signal having passed through the first low impedance preamplifier LA1, a second quadrature hybrid QH2 for quadrature compounding the receive signals received at the opposing coil sets 20 and 40 which are spaced 90° apart, a second low input impedance preamplifier LA2 for amplifying the signal having passed through the second quadrature hybrid QH2, a second impedance converting circuit CV2 for matching impedance between the second quadrature hybrid QH2 and the second low input impedance preamplifier LA2, a second converting circuit RC2 for frequency translating and A-D converting the signal having passed through the second low impedance preamplifier LA2, and a calculating circuit PS for performing digital operation on the digitized signals.

Since the receive signal processing circuit 2000 quadrature compounds the receive signals from the two opposing coil sets 10 and 30 orthogonal to each other and the receive signals from the two opposing coil sets 20 and 40 orthogonal to each other prior to supplying the signals to the converting circuits RC1 and RC2, only two converting circuits RC1 and RC2 are needed.

Fourth Embodiment

Figure 9:
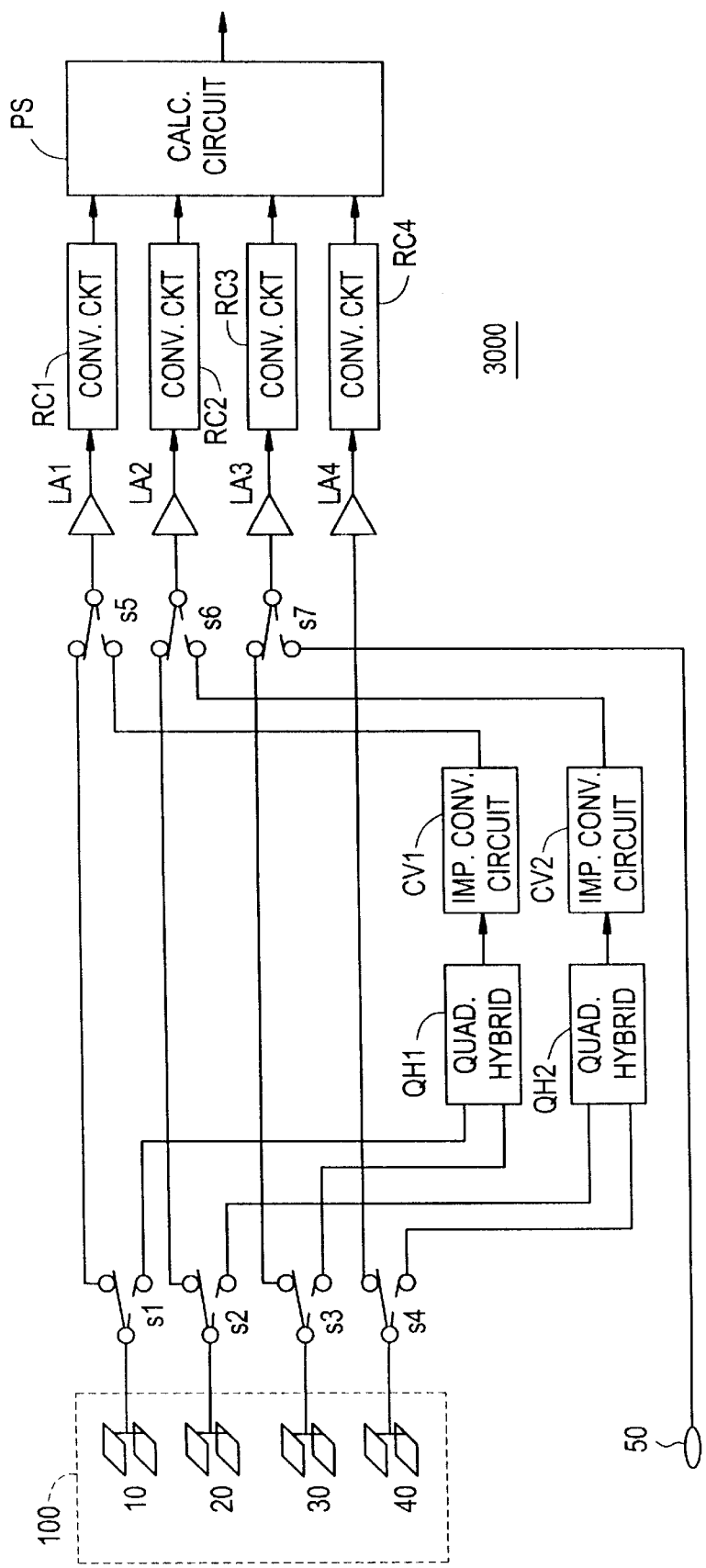
FIG. 9 is a block diagram of a receive signal processing circuit in accordance with a fourth embodiment of the present invention.

FIG. 9 is a block diagram illustrating a receive signal processing circuit in accordance with a fourth embodiment of the present invention.

The receive signal processing circuit 3000 is configured to be capable of switching between the receive signal circuit 5000 of FIG. 6 and the receive signal processing circuit 1000 of FIG. 7 by means of switches s1–s7, and capable of employing a contrast agent detecting coil 50.

When the switches s1–s7 are switched as indicated by solid lines in FIG. 9, the receive signals received at the opposing coil sets 10, 20, 30 and 40 in the phased-array coil 100 pass through the low input impedance preamplifier LA1, LA2, LA3 and LA4, are supplied to the converting circuit RC1, RC2, RC3 and RC4, and then are supplied to the calculating circuit PS.

On the other hand, when the switches s1–s7 are switched as indicated by broken lines in FIG. 9, the receive signals received at the opposing coil sets 10 and 30 in the phased-array coil 100 are quadrature compounded by the first quadrature hybrid QH1, and the compounded signal passes through the impedance converting circuit CV1 and the low input impedance preamplifier LA1, is supplied to the converting circuit RC1, and then is supplied to the calculating circuit PS. The receive signals received at the opposing coil sets 20 and 40 are quadrature compounded by the second quadrature hybrid QH2, and the compounded signal passes through the impedance converting circuit CV2 and the low input impedance preamplifier LA2, is supplied to the converting circuit RC2, and then is supplied to the calculating circuit PS. At the same time, a receive signal received at the contrast agent detecting coil 50 passes through the low input impedance amplifier LA3, is supplied to the converting circuit RC3, and then is supplied to the calculating circuit PS.

The receive signal processing circuit 3000 can be appropriately switched as necessary, and for example, can be used as a 4-channel phased array when a high S/N ratio is desired or can be used as a 2-channel phased array when the contrast agent detecting coil 50 is to be employed.

Fifth Embodiment

Figure 10:
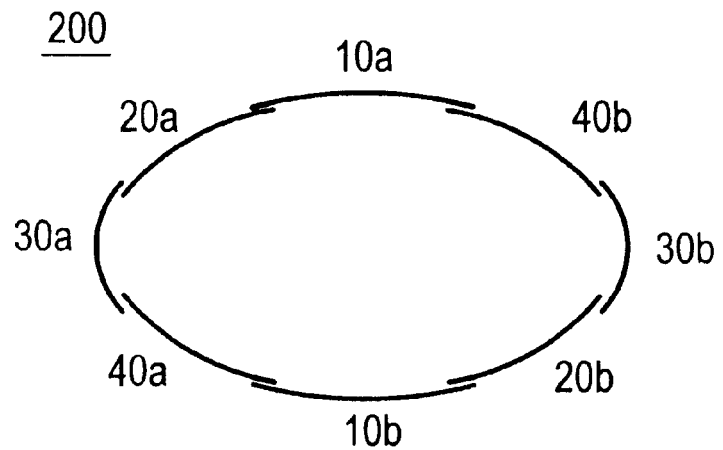
FIG. 10 is a view similar to FIG. 2 of an elliptical cylindrical phased-array coil in accordance with a fifth embodiment of the present invention.

FIG. 10 is an explanatory view illustrating an elliptical cylindrical phased-array coil in accordance with a fifth embodiment of the present invention.

The elliptical cylindrical phased-array coil 200 comprises four opposing coil sets (10*a*, 10*b*), (20*a*, 20*b*), (30*a*, 30*b*) and (40*a*, 40*b*) assembled into an elliptical cylindrical shape.

Because the opposing coil sets (20*a*, 20*b*) and (40*a*, 40*b*) are not orthogonal in the elliptical cylindrical phased-array coil 200, a low input impedance amplifier should be used to remove interaction therebetween. The phased-array coil 200 has the advantage of providing a sensitivity region of a shape conforming to the abdomen of a human body.

Sixth Embodiment

Figure 11:
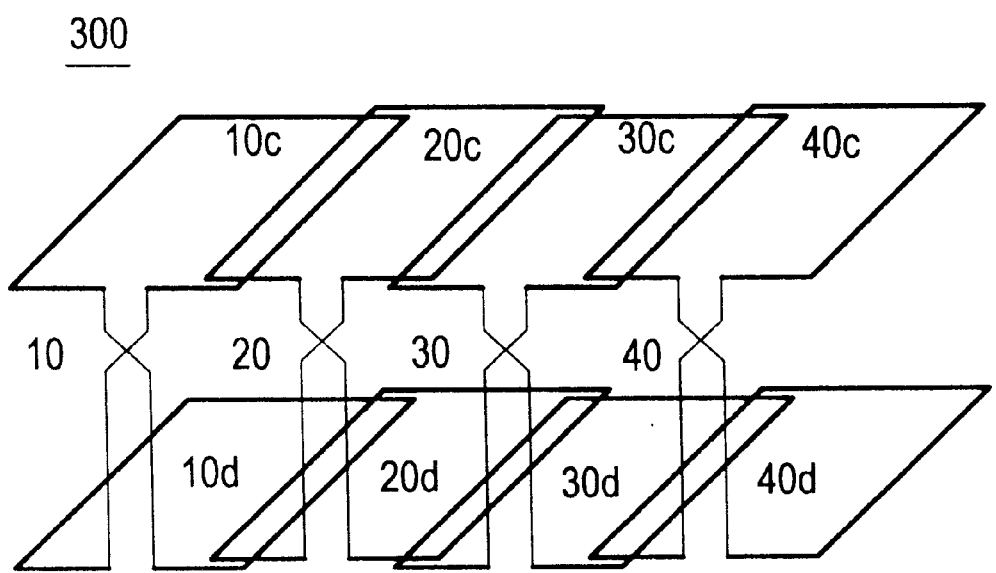
FIG. 11 is a schematic perspective view of a linear phased-array coil in accordance with a sixth embodiment of the present invention.

FIG. 11 is an explanatory view illustrating a linear phased-array coil in accordance with a sixth embodiment of the present invention.

The linear phased-array coil 300 comprises an opposing coil set 10 composed of a pair of flat planar coils 10*c* and 10*d* facing each other, an opposing coil set 20 composed of a pair of flat planar coils 20*c* and 20*d* facing each other, an opposing coil set 30 composed of a pair of flat planar coils 30*c* and 30*d* facing each other, and an opposing coil set 40 composed of a pair of flat planar coils 40*c* and 40*d* facing each other, disposed along an imaginary line.

Since any given opposing coil set interacts with opposing coil sets other than the adjacent ones in the linear phased-array coil 300, a low input impedance amplifier should be used to remove the interaction. The phased-array coil 300 has the advantage of providing a sensitivity region of a relatively free shape conforming to the shape of an object site to be imaged.

Seventh Embodiment

Figure 12:
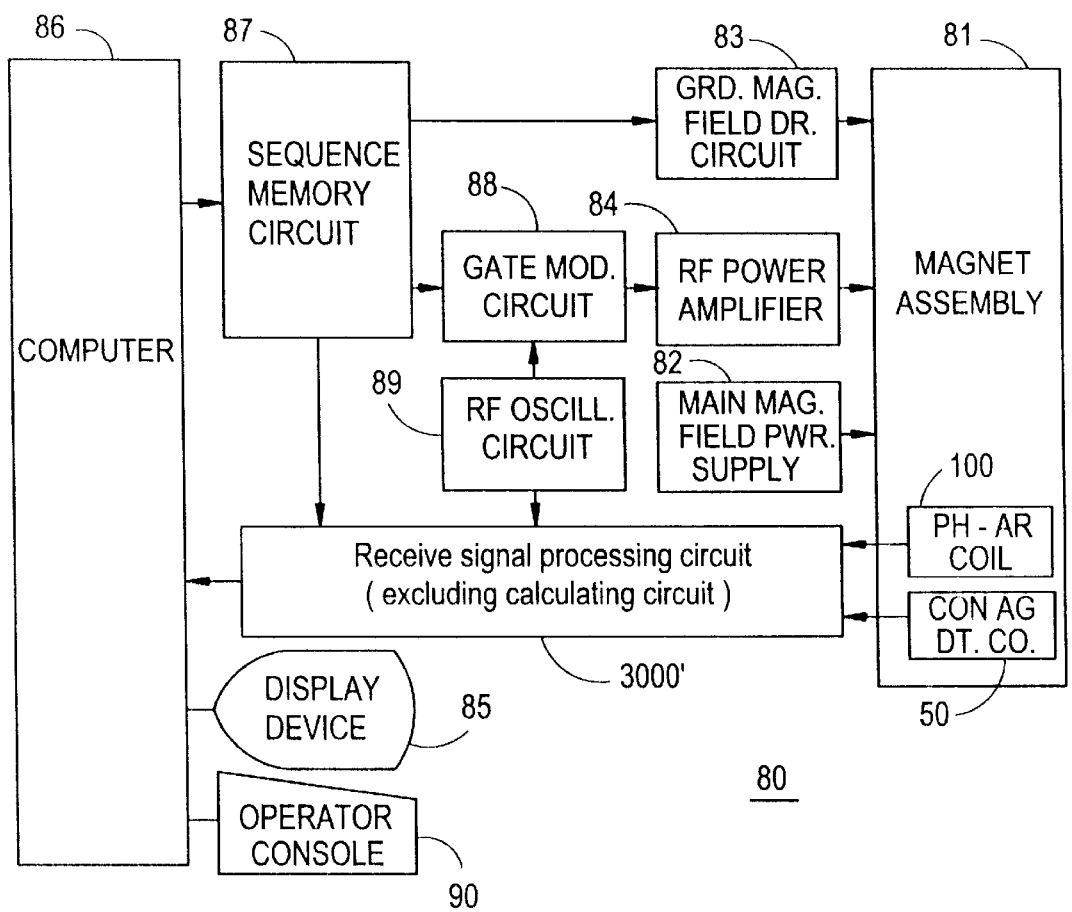
FIG. 12 is a block diagram of the configuration of an MRI apparatus in accordance with a seventh embodiment of the present invention.

FIG. 12 is a block diagram illustrating an MRI apparatus 80 in accordance with a seventh embodiment of the present invention.

In the MRI apparatus 80, a magnet assembly 81 has a space portion (bore) within which a subject is placed. Surrounding the space portion are disposed a main magnetic field coil for applying a constant main magnetic field to the subject, a gradient magnetic field coil for generating gradient magnetic fields (which is comprised of X-axis, Y-axis and Z-axis coils), a transmitter coil for applying an RF pulse for exciting spins in atomic nuclei within the subject, and a receiver coil for detecting an NMR (nuclear magnetic resonance) signal from the subject. The receiver coil comprises the phased-array coil 100 of FIG. 1 and the contrast agent detecting coil 50 of FIG. 9. The main magnetic field coil, the gradient magnetic field coil and the transmitter coil are connected to a main magnetic field power supply 82, a gradient magnetic field drive circuit 83 and an RF power amplifier 84, respectively. The phased-array coil 100 and the contrast agent detecting coil 50 are connected to a receive signal processing circuit 3000' which excludes the calculating circuit PS from the receive signal processing circuit 3000 of FIG. 9. A computer 86 acts as the calculating circuit PS, and the computer 86 and the receive signal processing circuit 3000' together constitute the receive signal processing circuit 3000.

In response to a command from the computer 86, a sequence memory circuit 87 operates the gradient magnetic field drive circuit 83 based on a pulse sequence such as those of the spin-echo technique to generate gradient magnetic fields from the gradient magnetic field coil in the magnet assembly 81. The sequence memory circuit 87 also operates a gate modulation circuit 88 to modulate a high frequency output signal from an RF oscillation circuit 89 into a pulse-like signal having a predetermined timing and envelope. The pulse-like signal is supplied to the RF power amplifier 84 as an RF pulse and is power amplified in the RF power amplifier 84. The power-amplified signal is then applied to the transmitter coil in the magnet assembly 81 to selectively excite a desired slice region.

The receive signal processing circuit 3000' amplifies the NMR signals detected from the subject at the phased-array coil 100 and the contrast agent detecting coil 50, frequency translates the signals with reference to output from the RF oscillation circuit 89 as a reference signal, and then A-DA-D converts the signals to supply the digitized signal to the computer 86.

The computer 86 acts as the calculating circuit PS of the receive signal processing circuit 3000 of FIG. 9. The computer 86 chooses timings using the receive signal from the contrast detecting coil 50, acquires data for all views within the k-space from the receive signal from the phased-array coil 100, and performs image reconstruction operation to produce an MR image. The MR image is displayed on a display device 85.

The computer also performs overall control, including receipt of information input from an operator console 90.

Since the MRI apparatus 80 employs the phased-array coil 100 having high sensitivity homogeneity and a high S/N ratio, a high quality image can be captured.

Other Embodiments

Other phased-array coils according to the invention include one which comprises a plurality of sets of opposing coils, each set consisting of a pair of bent planar coils opposing to each other formed by obtusely bending flat planar coils, having the coil surface partly overlapping the coil surface of adjacent one, disposed around the center axis of an imaginary angular cylinder to be assembled into an angular cylindrical shape (for example, an octagonal cylindrical shape) as a whole.

Moreover, an elbow-shaped linear phased-array coil, for example, may be configured by properly combining flat planar coils, curved planar coils and bent planar coils.

Many widely different embodiments of the invention may be configured without departing from the spirit and the scope of the present invention. It should be understood that the present invention is not limited to the specific embodiments described in the specification, except as defined in the appended claims.

What is claimed is:

1. A receive signal processing circuit for processing signals received by opposing coils in an array coil, said circuit comprising:

first quadrature compounding means for quadrature compounding signals received by a first group of opposing coils;

second quadrature compounding means for quadrature compounding signals received by a second group of opposing coils;

said first group of opposing coils and said second group of opposing coils comprise coils which are 90° apart in each group;

first converting means for A/D converting a signal passed through said first quadrature compounding means;

second converting means for A/D converting a signal passed through said second quadrature compounding means; and calculating means for performing digital operation on said convert signals.

2. The circuit of claim 1, wherein said array coil comprises: two or more sets of opposing coils, each set consisting of a pair of coils which face each other with their coil surfaces partly over lapping coil surfaces of adjacent ones, said opposing coils being disposed along an imaginary line.

3. The circuit of claim 2, wherein said imaginary line is a center axis of an imaginary cylinder with said opposing coils being of a cylindrical shape.

4. The circuit of claim 3, wherein said opposing coils comprise four sets of opposing coils, each set comprising a pair of gutter shaped coils with concave surfaces thereof facing each other and having coil surfaces which overlap adjacent ones by about 10% of the coil surface area, said gutter shaped coils being disposed around said center axis at an angular spacing of about 45° and assembled into said cylindrical shape.

5. The circuit of claim 2, wherein said pair of coils are planar coils.

6. The circuit of claim 1, further comprising:

means, comprising first impedance converting circuit and first amplifier, for processing a signal passed through said first quadrature compounding means and outputting the processed signal to said first converting means; and means, comprising second impedance converting circuit and second amplifier, for processing a signal passed through said second quadrature compounding means and outputting the processed signal to said second converting means.

7. The circuit of claim 6, further comprising means for passing signals both directly to said first and second quadrature compounding means and to said first and second amplifiers.

8. An array coil comprising:

two or more sets of opposing coils, each set consisting of a pair of coils which face each other with their coil surfaces partly overlapping coil surfaces of adjacent ones, said opposing coils being disposed along an imaginary line;

wherein said imaginary line is a center axis of an imaginary cylinder with said opposing coils being of a cylindrical shape; and wherein said opposing coils comprise four sets of opposing coils, each set comprising a pair of gutter shaped coils with concave surfaces thereof facing each other and having coil surfaces which overlap adjacent ones by about 10% of the coil surface area, said gutter shaped coils being disposed around said center axis at an angular spacing of about 45° and assembled into said cylindrical shape.

9. An MRI apparatus comprising:

an array coil comprising two or more sets of opposing coils, each set consisting of a pair of coils which face each other with their coil surfaces partly overlapping coil surfaces of adjacents ones, said opposing coils being disposed along an imaginary line;

wherein said imaginary line is a center axis of an imaginary cylinder with said opposing coils being of a cylindrical shape; and wherein said opposing coils comprise four sets of opposing coils, each set comprising a pair of gutter shaped coils with concave surfaces thereof facing each other and having coils surfaces which overlap adjacent ones by about 10% of the coil surface area, said gutter shaped coils being disposed around said center axis at an angular space of about 45° and assembled into said cylindrical shape.

10. The apparatus of claim 9, further comprising a receive signal processing circuit for processing signal received by opposing coils in said array coil, said circuit comprising:

first quadrature compounding means for quadrature compounding signals received by a first group of opposing coils;

second quadrature compounding means for quadrature compounding signals received by a second group of opposing coils;

said first group of opposing coils and said second group of opposing coils comprise coils which are 90° apart in each group;

first converting means for A/D converting a signal passed through said first quadrature compounding means;

second converting means for A/D converting a signal passed through said second quadrature compounding means; and calculating means for performing digital operations on said converted signals.

* * * * *